(12) United States Patent
Bell et al.

(10) Patent No.: US 8,445,772 B2
(45) Date of Patent: May 21, 2013

(54) THERMOELECTRIC POWER GENERATOR WITH INTERMEDIATE LOOP

(75) Inventors: Lon E. Bell, Altadena, CA (US); Douglas Todd Crane, Altadena, CA (US)

(73) Assignee: BSST, LLC, Irwindale, CA (US)

( * ) Notice: Subject to any disclaimer, the term of this patent is extended or adjusted under 35 U.S.C. 154(b) by 143 days.

(21) Appl. No.: 12/579,368

(22) Filed: Oct. 14, 2009

(65) Prior Publication Data

US 2010/0095996 A1   Apr. 22, 2010

Related U.S. Application Data

(63) Continuation of application No. 11/476,326, filed on Jun. 28, 2006, now Pat. No. 7,608,777.

(60) Provisional application No. 60/694,746, filed on Jun. 28, 2005.

(51) Int. Cl.
*H01L 35/30* (2006.01)

(52) U.S. Cl.
USPC .......................................... 136/205; 136/200

(58) Field of Classification Search
USPC .................... 136/201–242; 60/285, 272, 324, 60/320
See application file for complete search history.

(56) References Cited

U.S. PATENT DOCUMENTS

| | | | |
|---|---|---|---|
| 2,362,259 A | 11/1944 | Findley | |
| 2,363,168 A | 11/1944 | Findley | |
| 2,519,241 A | 8/1950 | Findley | |
| 3,197,342 A | 7/1965 | Neild, Jr. | |
| 3,817,043 A | 6/1974 | Zoleta | |
| 4,047,093 A | 9/1977 | Levoy | |
| 4,125,122 A | 11/1978 | Stachurski | |
| 4,448,028 A | 5/1984 | Chao et al. | |
| 4,753,682 A | 6/1988 | Cantoni | |
| 4,885,087 A | 12/1989 | Kopf | |
| 5,419,780 A | 5/1995 | Suski | |
| 5,563,368 A | 10/1996 | Yamaguchi | |
| 5,566,774 A | 10/1996 | Yoshida | |
| 5,705,770 A | 1/1998 | Ogasawara et al. | |
| 5,713,426 A | 2/1998 | Okamura | |

(Continued)

FOREIGN PATENT DOCUMENTS

| | | |
|---|---|---|
| CN | 1195090 | 10/1998 |
| CN | 1249067 A | 3/2000 |

(Continued)

OTHER PUBLICATIONS

Bass, J.C. et al., Performance of the 1 kW Thermoelectric Generator for Diesel Engines, American Institute of Physics, 1995, p. 295-298.

(Continued)

*Primary Examiner* — Keith Hendricks
*Assistant Examiner* — Kourtney S Carlson
(74) *Attorney, Agent, or Firm* — Knobbe, Martens, Olson & Bear LLP

(57) ABSTRACT

A thermoelectric power generator is disclosed for use to generate electrical power from heat, typically waste heat. An intermediate heat transfer loop forms a part of the system to permit added control and adjustability in the system. This allows the thermoelectric power generator to more effectively and efficiently generate power in the face of dynamically varying temperatures and heat flux conditions, such as where the heat source is the exhaust of an automobile, or any other heat source with dynamic temperature and heat flux conditions.

11 Claims, 5 Drawing Sheets

U.S. PATENT DOCUMENTS

| | | | |
|---|---|---|---|
| 6,127,766 | A | 10/2000 | Roidt |
| 6,367,261 | B1 | 4/2002 | Marshall et al. |
| 6,539,725 | B2 | 4/2003 | Bell |
| 6,539,729 | B2 | 4/2003 | Tupis et al. |
| 6,598,405 | B2 | 7/2003 | Bell |
| 6,605,773 | B2 | 8/2003 | Kok |
| 6,625,990 | B2 | 9/2003 | Bell |
| 6,672,076 | B2 | 1/2004 | Bell |
| 6,886,356 | B2 | 5/2005 | Kubo et al. |
| 6,975,060 | B2 | 12/2005 | Styblo et al. |
| 6,986,247 | B1 | 1/2006 | Parise |
| 7,100,369 | B2 | 9/2006 | Yamaguchi et al. |
| 7,231,772 | B2 | 6/2007 | Bell |
| 7,273,981 | B2 | 9/2007 | Bell |
| 7,608,777 | B2 | 10/2009 | Bell et al. |
| 2001/0029974 | A1 | 10/2001 | Cohen et al. |
| 2002/0014261 | A1 | 2/2002 | Caillat et al. |
| 2004/0045594 | A1 | 3/2004 | Hightower |
| 2004/0261831 | A1 | 12/2004 | Tsuneoka et al. |
| 2004/0267408 | A1 | 12/2004 | Kramer |
| 2005/0000473 | A1 | 1/2005 | Ap et al. |
| 2005/0074646 | A1 | 4/2005 | Rajashekara et al. |
| 2005/0194034 | A1 | 9/2005 | Yamaguchi et al. |
| 2005/0247336 | A1 | 11/2005 | Inaoka |
| 2005/0263176 | A1 | 12/2005 | Yamaguchi et al. |
| 2006/0130888 | A1 | 6/2006 | Yamaguchi et al. |
| 2006/0157102 | A1 | 7/2006 | Nakajima et al. |
| 2007/0272290 | A1 | 11/2007 | Sims et al. |
| 2008/0035195 | A1 | 2/2008 | Bell |
| 2010/0024859 | A1 | 2/2010 | Bell et al. |
| 2010/0095996 | A1 | 4/2010 | Bell |
| 2010/0236595 | A1 | 9/2010 | Bell |
| 2010/0326092 | A1 | 12/2010 | Goenka |
| 2011/0067742 | A1 | 3/2011 | Bell et al. |

FOREIGN PATENT DOCUMENTS

| | | | |
|---|---|---|---|
| EP | 1 475 532 | A | 11/2004 |
| EP | 1 679 480 | A | 7/2006 |
| JP | 5-219765 | | 8/1993 |
| JP | 07-074397 | | 3/1995 |
| JP | 7 156645 | | 6/1995 |
| JP | 08-098569 | | 4/1996 |
| JP | 11-201475 | A | 7/1999 |
| JP | 11-274575 | | 10/1999 |
| JP | 11-041959 | | 12/1999 |
| JP | 2000 018095 | | 1/2000 |
| JP | 00 208823 | | 7/2000 |
| JP | 2000-286469 | A | 10/2000 |
| JP | 2000-323759 | | 11/2000 |
| JP | 2001-210879 | | 8/2001 |
| JP | 2002-199761 | | 7/2002 |
| JP | 2003-86223 | | 3/2003 |
| JP | 2003175720 | A | 6/2003 |
| JP | 2004 343898 | | 12/2004 |
| JP | 2004-360522 | | 12/2004 |
| JP | 2005-212564 | | 8/2005 |
| JP | 07 111334 | | 10/2005 |
| JP | 2006 214350 | | 8/2006 |
| JP | 2008 042994 | | 2/2008 |
| JP | 2008 274790 | | 11/2008 |
| JP | 2009 033806 | | 2/2009 |
| RU | 2 099 642 | C1 | 12/1997 |
| RU | 2174475 | | 10/2001 |
| WO | WO 95/01500 | | 1/1995 |
| WO | WO 2004/092662 | | 10/2004 |
| WO | WO 2005/098225 | A | 10/2005 |
| WO | WO 2006/064432 | A | 6/2006 |
| WO | WO 2008/042077 | | 4/2008 |
| WO | WO 2008/123330 | | 10/2008 |

OTHER PUBLICATIONS

Bell, L.E., "Increased Thermoelectric System Thermodynamic Efficiency by Use of Convective Heat Transport," Proc. $21^{st}$ Intl Conf. on Thermoelectronics, Long Beach, CA (Aug. 2002).

Bell, Lon E., "High Power Density Thermoelectric Systems", BSST LLC, Irwindale, CA, 23rd International Conference on Thermoelectronics, Adelaide, Australia, Jul. 2004.

Birkholz, Ulrich et al., "Conversion of Waste Exhaust Heat in Automobiles Using FeSi2-Thermoelements,"7th International Conference on Te Energy Conversion, p. 124-128, 1988.

BSST LLC, "Freedom Car & Vehicle Technologies Program, BSST LLC Project Phase 1 Report: High Efficiency Thermoelectric Waste Energy Recovery System for Passenger Vehicle Application", U.S. Department of Energy, Jun. 1, 2005, p. 1-95.

Cobble, Milan H., Calculations of Generator Performance, CRC Press, Inc. 1995, p. 489.

Crane, D. T., "Modeling High-Power Density Thermoelectric Assemblies Which Use Thermal Isolation," BSST LLC, Irwindale, CA, 23rd International Conference of Thermoelectronics, Adelaide, Australia, Jul. 2004.

Crane, Douglas T., "Optimizing Thermoelectric Waste Heat Recovery From an Automobile Cooling System, Dissertation" submitted to the Faculty of Graduate School of the University of Maryland, 2003.

Hendricks, Terry et al., "Advanced Thermoelectric Power System Investigations for Light-Duty and Heavy Duty Applications," National Renewable Energy Laboratory, Center for Transportation Technology & Systems, Colorado, 2002.

Hsu, Kuei Fang et al., Cubic AgPbmSbTe2+m: Bulk Thermoelectric Materials with High Figure of Merit, Science, Feb. 6, 2004, p. 818-821, vol. 303.

Ikoma, K., et al., "Thermoelectric Module and Generator for Gasoline Engine Vehicles," 17th Int'l Conf. on Thermo-electrics, Nagoya, Japan, pp. 464-467 (1998).

International Preliminary Report on Patentability for International Application No. PCT/US2006/025533, filed on Jun. 28, 2006, completed on Feb. 29, 2008 in 10 pages.

International Search Report and Written Opinion for International Application No. PCT/US2006/025533, filed on Jun. 28, 2006, mailed on Aug. 11, 2007 in 13 pages.

Lofy, John et al., "Thermoelectrics for Environmental Control Automobiles," 21st International Conference on Thermoelectronics 2002, p. 471-476.

Menchen, William R., et al., "Thermoelectric Conversion to Recover Heavy Duty Diesel Exhaust Energy," Teledyne Energy Systems, Timonium, MD 1990.

Snyder, G. Jeffrey, et al., "Thermoelectric Efficiency and Compatibility," The American Physical Society, Oct. 2, 2003, vol. 91, No. 14.

Snyder, G. Jeffrey: "Application of the compatibility factor to the design of segmented and cascaded thermoelectric generators" Applied Physics Letters, AIP, American Institute of Physics, Melville, NY, vol. 84, No. 13, Mar. 29, 2004, pp. 2436-2438, XP012060957 ISSN: 0003-6951.

Ursell, T.S. et al., "Compatibility of Segmented Thermoelectric Generators," 21st International Conference on Thermoelectronics, 2002, p. 412-417.

Crane, D. T.: "Progress Towards Maximizing the Performance of a thermoelectric Power Generator", ICT '06, 25th, USA, IEEE, Aug. 1, 2006, 11-16l.

THERMOELECTRIC POWER GENERATOR WITH INTERMEDIATE LOOP

CROSS-REFERENCE TO RELATED APPLICATIONS

This application is a continuation of U.S. patent application Ser. No. 11/476,326, filed Jun. 28, 2006, and incorporated in its entirety by reference herein, which claims priority under 35 U.S.C. §119(e) to 60/694,746, entitled "High-Efficiency Thermoelectric Waste Energy Recovery System for Passenger Vehicle Applications," filed Jun. 28, 2005, the entire contents of which are hereby incorporated by reference herein.

STATEMENT REGARDING FEDERALLY SPONSORED R&D

The U.S. Government may claim to have certain rights in this invention or parts of this invention under Contract No. DE-FC26-04NT42279 awarded by the U.S. Department of Energy.

BACKGROUND OF THE INVENTION

1. Field of the Invention

The present application relates to the field of thermoelectric power generation, and more particularly to systems for improving the generation of power from thermoelectrics, particularly in the situation where there are limitations in the system on the temperature differential across the thermoelectric.

2. Description of the Related Art

Thermoelectrics are solid state devices that operate to become cold on one side and hot on the other side when electrical current passes through. They can also generate power by maintaining a temperature differential across the thermoelectric. Under many operating conditions, however, thermoelectric power generators are exposed to a combination of changing heat fluxes, hot side heat source temperatures, cold side temperatures, and other variable conditions. In addition, the device properties, such as TE thermal conductance, figure of merit Z, heat exchanger performance all have a range that can combine to, in general, reduce device performance. As a result, performance varies and operation at a predetermined set point can lead to performance degradation compared to the design.

Any process that consumes energy that is not 100% efficient generates waste energy, often in the form of heat. For example, engines generate a substantial amount of waste heat, representing inefficiency in the engine. Various ways to attempt to capture and use some of this waste heat have been considered in order to improve the efficiency of any type of engine, such as the engine in automobiles. Placing thermoelectrics on the exhaust system of an automobile has been contemplated (See U.S. Pat. No. 6,986,247 entitled Thermoelectric Catalytic Power Generator with Preheat). However, the exhaust system varies greatly in temperatures and heat flux. Thus, because a thermoelectric generator is typically designed to operate effectively over a small range of hot side temperatures, using exhaust for the hot side of a thermoelectric generator is suboptimal. In addition, a logical cold side coolant for a thermoelectric generator linked to an engine system is the engine coolant already provided. However, the coolant needs to be maintained at a fairly hot temperature for efficient engine operation. Thus, using the existing coolant limits the temperature gradient that can be established across the thermoelectric generator, thereby limiting effective waste heat recovery.

SUMMARY OF THE INVENTION

Thermoelectric (TE) power generation from waste heat has suffered for many reasons in the past. The described invention addresses some of these delinquencies, greatly improving the capability of the TE generator. The improvement is generally obtained by providing an intermediate loop for the cool side, for the hot side or for both, and in one embodiment, providing advanced control for the intermediate loop or loops. Due to the great variability of the waste heat generated from an automobile engine, the present invention is presented in the context of a thermoelectric generation system using waste heat from an engine of an automobile as the thermal power source. This example permits an effective disclosure of the features of the invention. However, the present invention is not limited to thermoelectric generators for automobiles, or even for engines. The present invention has application in any thermoelectric generation system.

To effectively maximize the performance of a waste heat recovery system using thermoelectrics, maintaining the highest temperature differential across the thermoelectric generator module (TGM) is generally ideal. One way to do this is to keep the hot-side temperatures as high as possible. Another method is to better control the cold-side temperatures. By using an intermediate heat transfer loop and appropriate control for that loop for the hot side, the cold side, or both, significant improvements to power production and/or efficiency are obtained.

In the past (See U.S. Pat. No. 6,986,247), TE modules have been proposed as a lining around pipes or tubes carrying hot fluid, such as the exhaust system of an automobile. This provides intimate contact between the hot fluid and the TE material, which is desirable to maximize the hot-side temperature of the TE material as well as the temperature difference across the TE material. This may be fine or even optimal for a static system where the hot fluid flow rates and temperatures do not change. The TE elements can be designed to provide a perfect impedance match with the hot fluid flow. This impedance match is important since element geometry can greatly affect the amount of heat that can be effectively transferred through the TE elements. For a static system, the thermoelectric system can be designed for steady state operation at maximum efficiency or maximum power output or a combination acceptable to the designer.

However, once the system becomes dynamic, as in the case of an automobile driven by an engine, where the range of temperatures and heat flux vary greatly, a thermoelectric generation system designed for a particular set of conditions may only produce a small fraction of its capacity, or even become negative under certain operating conditions. In the present invention, by providing a separate heat transfer loop for the cold side, the hot side or both, and appropriate control for such loop or loops, substantial improvements are obtained making such systems feasible in actual use.

One aspect of the present invention involves a thermoelectric power generation system. The system has a thermoelectric generator having thermoelectrics with at least one cold side and at least one hot side configured to generate electrical power when a temperature gradient is present between said at least one cold side and said at least one hot side. An intermediate heat transfer loop is in thermal communication with said at least one hot side and is in thermal communication with at least one main heat source. A controller is in communication with flow control devices in said intermediate heat transfer loop and is adapted to control the heat flow in the intermediate heat transfer loop in response to changes in heat originating from the at least one main heat source.

In one embodiment, the system further comprises thermal storage. The thermal storage may be in the intermediate loop, associated with the main heat source or associated with both the intermediate loop and the main heat source. Advantageously, a heat exchanger between the intermediate heat transfer loop and the main heat source facilitates the movement of thermal power from the main heat source to the intermediate heat transfer loop. Prefereably, a heat exchanger bypass is controllable via the controller to cause some or all of the heat from the main heat source to bypass the heat exchanger, depending on the heat from the main heat source and the capacity of the thermoelectrics.

Another aspect of the present invention involves a thermoelectric power generation system for a main heat source. A thermoelectric generator has thermoelectrics with at least one cold side and at least one hot side configured to generate electrical power when a temperature gradient is present across said at least one cold side and said at least one hot side. An intermediate heat transfer loop is preferably in thermal communication with said at least one cold side and in communication with at least one heat dissipation device. Preferably, the heat dissipation device is separate from a main heat source. A controller in communication with flow control devices in said intermediate heat transfer loop is adaptive to control the heat flow in the intermediate heat transfer loop in response to changes in operating conditions for the thermoelectrics and/or the heat output from the main heat source.

In one embodiment, the heat source is an engine, having a main coolant system. Preferably, the intermediate heat transfer loop can be thermally connectable to the main coolant system of the engine, such that during engine warm-up, heat transferred from the thermoelectrics to the intermediate heat transfer loop is further transferred to the main cooling system for the engine, thereby decreasing warm-up time for the engine. Further, a heat exchanger is advantageously provided between the intermediate heat transfer loop and the main heat source, with an optional a heat exchanger bypass controllable via the controller, to cause some or all of the heat from the main heat source to bypass the heat exchanger.

Yet another aspect of the present invention involves a method of generating power from waste heat from a main heat source using a thermoelectric generator having thermoelectrics with at least one cold side and at least one hot side configured to generate electrical power when a temperature gradient is present across said at least one cold side and said at least one hot side. The method involves transferring heat from the main heat source to an intermediate heat transfer loop, where the intermediate heat transfer loop is in thermal communication with a heat dissipation device. The flow of heat is controlled in the intermediate heat transfer loop in response to changes in operating conditions of the main heat source.

In one embodiment, the heat source is an engine, having a main coolant system. In this embodiment, preferably, the intermediate heat transfer loop can be thermally connectable to the main coolant system of the engine. Thereby, during engine warm-up, heat is transferred transferring from the thermoelectrics to the intermediate heat transfer loop and further to the main coolant system for the engine, thereby decreasing warm-up time for the engine.

In one embodiment, the flow of heat from the main heat source to the intermediate loop is controlled based on changing heat flux of the main heat source and the capacity of the thermoelectric generator.

Further aspects and features of the invention are disclosed in connection with the description below.

DETAILED DESCRIPTION OF THE PREFERRED EMBODIMENT

Figure 1:
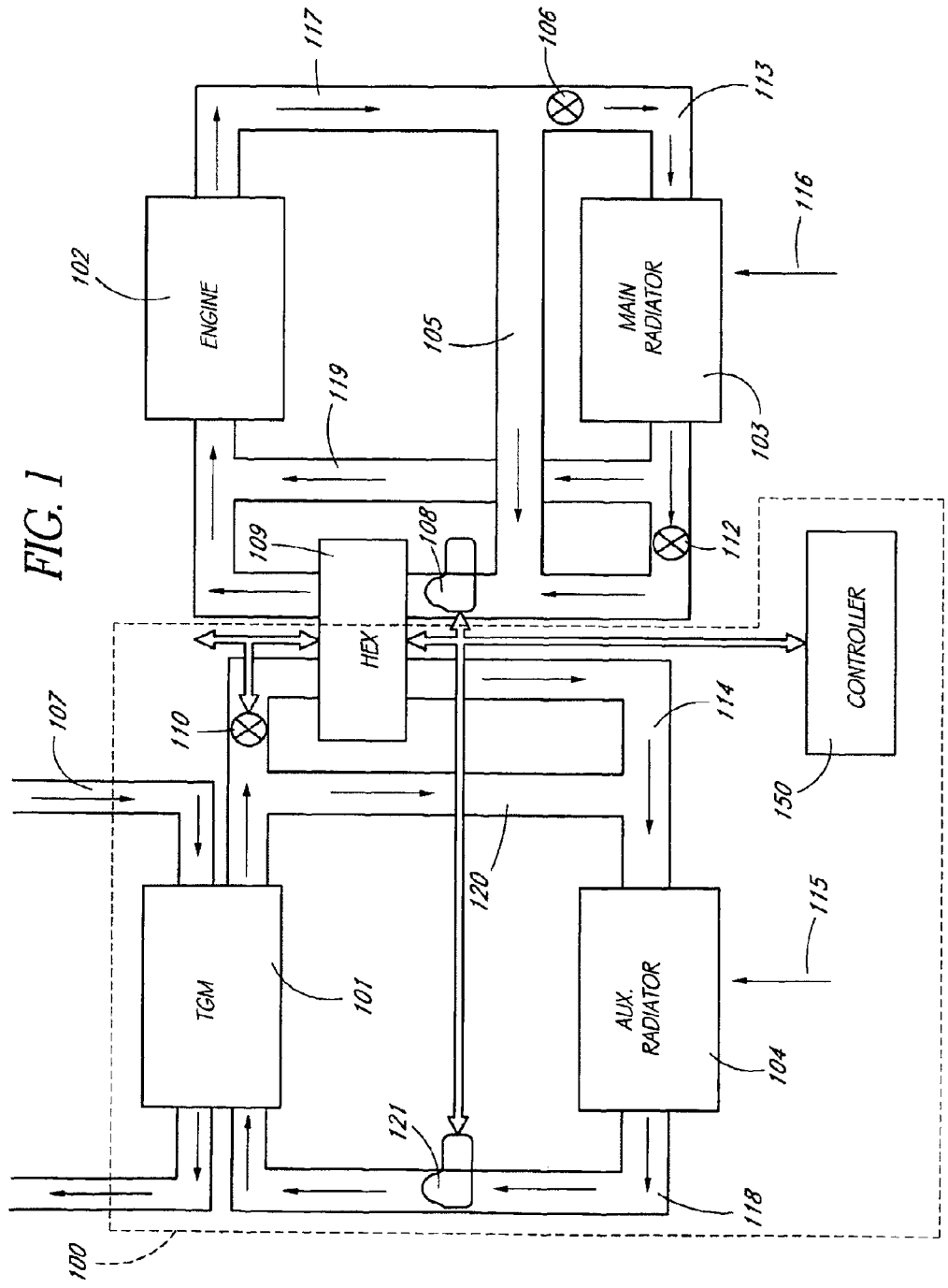
FIG. 1 illustrates a thermoelectric generation system with a cold-side intermediate heat transfer loop.

Automotive waste heat recovery is used as an example of the present invention. However, the invention is applicable to improve the performance of power generation, waste heat recovery, cogeneration, power production augmentation, and other uses. As further examples, the present invention can be used to utilize waste heat in the engine coolant, transmission oil, brakes, catalytic converters, and other sources in cars, trucks, busses, trains, aircraft and other vehicles. Similarly, waste heat from chemical processes, glass manufacture, cement manufacture, and other industrial processes can be utilized. Other sources of waste heat such as from biowaste, trash incineration, burn off from refuse dumps, oil well burn off, can be used. Power can be produced from solar, nuclear, geothermal and other heat sources. Application to portable, primary, standby, emergency, remote, personal and other power production devices are also part of this invention. In addition, the present invention can be coupled to other devices in cogeneration systems, such as photovoltaic, fuel cell, fuel cell reformers, nuclear, internal, external and catalytic combustors, and other advantageous cogeneration systems. It should also be understood that the number of TE modules described in any embodiment herein is not of any import, but is merely selected to illustrate the invention.

The present invention is introduced using examples and particular embodiments for descriptive and illustrative purposes. Although examples are presented to show how various configurations can be employed to achieve the desired improvements, the particular embodiments are only illustrative and not intended in any way to restrict the inventions presented. It should also be noted that the term thermoelectric or thermoelectric element as used herein can mean individual thermoelectric elements as well as a collection of elements or arrays of elements. Further, the term thermoelectric is not restrictive, but used to include thermoionic and all other solid-state cooling and heating devices. In addition, the terms hot and cool or cold are relative to each other and do not indicate any particular temperature relative to room temperature or the like. Finally, the term working fluid is not limited to a single fluid, but can refer to one or more working fluids.

Cold Side Intermediate Loop

The cold-side temperatures that the theremoelectric generator module (TGM) are exposed to are often controlled by a cold-side loop. In the context of an engine, this cold-side loop can be the traditional vehicle radiator coolant loop, a stand-alone coolant loop or heat dissipator, or a combination of both. The radiator cooling loop has the advantage that it is already available. Little additional design work may be needed. The capacity of the coolant loop would merely need to be sufficient to handle the additional heat that would be dumped into it from the waste heat transferred through the TGM.

The temperatures in a traditional radiator are maintained at approximately 80°-110° C. These temperatures have been established based on optimal engine performance and sufficient fan size. By dumping additional waste heat from a TGM system into the radiator coolant loop during startup, substantial reductions in fuel consumption and emissions can be achieved due to increased warm-up speeds for the engine and catalytic converter. Additional waste heat in the main radiator cooling system also has the benefit in cooler weather of faster time to passenger compartment warmup, as well as improvement in warmup time of other vehicle fluids, such as engine oil and other engine lubrication fluids. These are positive effects of using the traditional radiator coolant loop to maintain the cold-side of the TGM.

However, using the radiator as the cold side heat sink for the TGM limits the ability to reduce the cold-side temperature below 80 C without adversely affecting engine efficiency. Thus, in accordance with one aspect of the present invention, an intermediate or stand-alone cooling loop for the cold side of the TGM provides for possible reduction in the cold-side temperature. This permits an increase in the temperature differential across the TGM. Cooling for this intermediate cooling loop may be provided by an additional fan or a greater surface area heat sink. In one embodiment, the main chassis of the vehicle could provide a large heat sink.

In another embodiment, the intermediate loop is coupled or in thermal communication with the main coolant radiator during startup, and decoupled for the remainder of operation. This would permit the faster warm-up times, yet permit maximizing the beneficial effects of the cold-side cooling system of the TGM. The embodiment described below incorporates these features.

FIG. 1 schematically illustrates one embodiment of a thermoelectric generation system 100 in the context of using waste heat from an engine or any other heat source as the thermal power source for the thermoelectric generator module. The thermoelectric generation system 100 has a thermoelectric generator module (TGM) 101, an auxiliary cooler, which can be any air—liquid heat exchanger known in the art, such as an auxiliary radiator 104, an auxiliary cold-side working fluid loop 118, an auxiliary pump or other device that controls fluid flow known in the art 121, an auxiliary cold-side working (heat transfer) fluid 114, a bypass 120, and a hot side working fluid 107, such as exhaust, superheated steam, or any heat source. The hot side working fluid 107 may also be an auxiliary heat transfer fluid in a separate hot side heat transfer loop, where the heat was obtained from the exhaust. This auxiliary heat transfer fluid will be discussed further relating to FIG. 3. The auxiliary cold-side heat transfer fluid 114 can be a liquid or molten salt such as liquid metal or NaK. It can also be a heat transfer fluid such as ethylene glycol/water or those made by Dow or other advantageous heat transfer fluids known in the art. It can also be superheated or saturated steam or another type of two-phase fluid. The auxiliary cold-side heat transfer fluid 114 can also be a gas like helium, hydrogen, air, or carbon dioxide or any other high heat transfer gas that can be operated at above atmospheric pressure in order to reduce pumping losses. The TGM 101 includes hot and cold side heat exchangers, TE elements, and electrical connectors between TE elements (not shown), preferably incorporating thermal isolation in the direction of working fluid flow, as described in U.S. Pat. No. 6,539,729, entitled Efficiency Thermoelectrics Utilizing Thermal Isolation, which patent is hereby incorporated by reference herein The TE elements in the TGM 304 can be thermally isolated advanced high power density designs or can be made of standard thermoelectric modules known in the art.

The thermoelectric generation system 100 is coupled at the cold side via a heat exchanger (hex) 109 to a the cooling system for an engine or any other heat source 102 having a main radiator 103, a first bypass 105, a second bypass 119, a thermostat or valve or other fluid control mechanism known in the art 106, a radiator valve or other fluid control mechanism known in the art 112, main coolant 113, and a main pump 108. This connection to the cooling system of the engine 102 is optional. By providing the interconnection, faster warm-up times can be achieved for the engine, passenger compartment, and the like, during engine warm up. It will then be appreciated that the intermediate cold-side working fluid loop 118 may be completely uncoupled from the engine cooling system, and provide benefits of the present invention of an intermediate cold-side heat transfer loop, not limited by the operating restrictions on the coolant system for the engine.

A controller 150 monitors and controls operation. A number of sensors are advantageously strategically placed to monitor the system. These sensors are preferably temperature and/or flow sensors. The controller then communicates with control mechanisms such as the pumps 108, 121 and valves 110, 112. The particular connections shown are merely exemplary, and sensors and control connections are provided as appropriate for the system design.

During steady state operation, main coolant 113 is circulated through the main coolant loop 117 using main pump 108. The main coolant 113 is returned to the engine 102 after it has gone through the main radiator 103 and been cooled by the airflow 116, which can be ram or fan air, flowing across the main radiator 103 in a typical cross-flow heat exchanger. This is standard operation for a vehicle cooling system. During vehicle startup, it is also standard for the thermostat 106 to prevent main cold flow 113 through the main radiator 103, directing it through the bypass 105 and back to the engine 102. This allows the main coolant 113, and thus the engine 102, to warm up faster. Engines are designed to run at higher efficiencies once they are warm. In addition, the catalytic converter in the exhaust system of the vehicle, which helps reduce harmful emissions, does not start being effective until its internal temperature reaches a specific "light off" temperature for its internal catalysts. Thus, it is possible to reduce emissions and increase vehicle fuel economy by warming up the engine faster.

The thermoelectric generator module (TGM) 101 is the component in the thermoelectric generation system 100 that generates electrical power from the waste heat of the vehicle. The TGM 101 can operate more efficiently if its cold-side temperature is kept as cold as possible. The main coolant 113 must operate between 80-110 C to allow the engine to operate properly. This is the case no matter what the ambient temperature outside. The TGM 101 operates more effectively at a lower cold-side temperature than this. Thus, the TGM 101 is connected to the auxiliary cold-side heat transfer loop 118 using the auxiliary radiator 104. The auxiliary heat transfer fluid 114 is pumped through the auxiliary radiator 104 and back to the TGM 101 with the auxiliary pump 121. Airflow 115, which can be ram or fan air, flows across the auxiliary radiator 104, which may also be a cross-flow heat exchanger, removing heat from the auxiliary cold side working fluid 114. The auxiliary coolant 114 is now independent from the main coolant 113, and thus can be controlled by a separate pump and maintained at a temperature closer to ambient.

In one embodiment, to maximize performance throughout the drive cycle and take as much advantage of the waste heat as possible, the main coolant loop 117 and the auxiliary coolant loop 118 are connected with an optional heat exchanger 109. During vehicle startup, valve 112 is open allowing main coolant 113 to flow through heat exchanger 109. Valve 110 is also open allowing auxiliary coolant 114 to flow through heat exchanger 109 transferring waste heat from the TGM 101 stored in the auxiliary cold fluid 114 to the main coolant 113. This allows the engine and catalytic converter to warm up faster providing the benefits described above. It will be understood that the heat exchanger 109 could simply interconnect the two cooling loops 117, 118, or could be a heat exchanger which facilitates heat transfer between the main coolant 113 and the auxiliary coolant 114.

Once the engine 102 reaches operating temperature, and the catalytic converter (not shown) has reached "light off" temperature, sensors (not shown), which may exist in the main coolant loop 117, intermediate coolant loop 118, engine 102, and the catalytic converter (not shown), communicate this information to controller 150. Controller 150 then closes valves 110 and 112 preventing main coolant 113 and auxiliary heat transfer fluid 114 from going through heat exchanger 109. In this embodiment, this effectively isolates the two systems. Controller 150 may also control pump speed for both auxiliary pump 121 and/or main pump 108. Main coolant 113 circulates through bypass 119 and auxiliary cold fluid travels through bypass 120. The main coolant loop 117 can operate at one temperature and the auxiliary heat transfer loop 118 can operate at another, preferably lower, temperature. Hot side fluid 107 flows through the TGM 101 to provide heat and higher temperature for the hot side of the TGM 101.

As briefly mentioned above, the hot-side fluid 107 may be exhaust from the engine 102, or may, in a preferred embodiment, be a separate hot-side heat transfer fluid, as will be explained further herein. Main pump 108 may be a similar or different device from that of auxiliary pump 121. Similarly, main valve 112 may be similar or different to auxiliary valve 110. Main radiator 103 may be similar or different from auxiliary radiator 104. Main coolant fluid 113 may be similar or different from auxiliary coolant 114.

Figure 2:
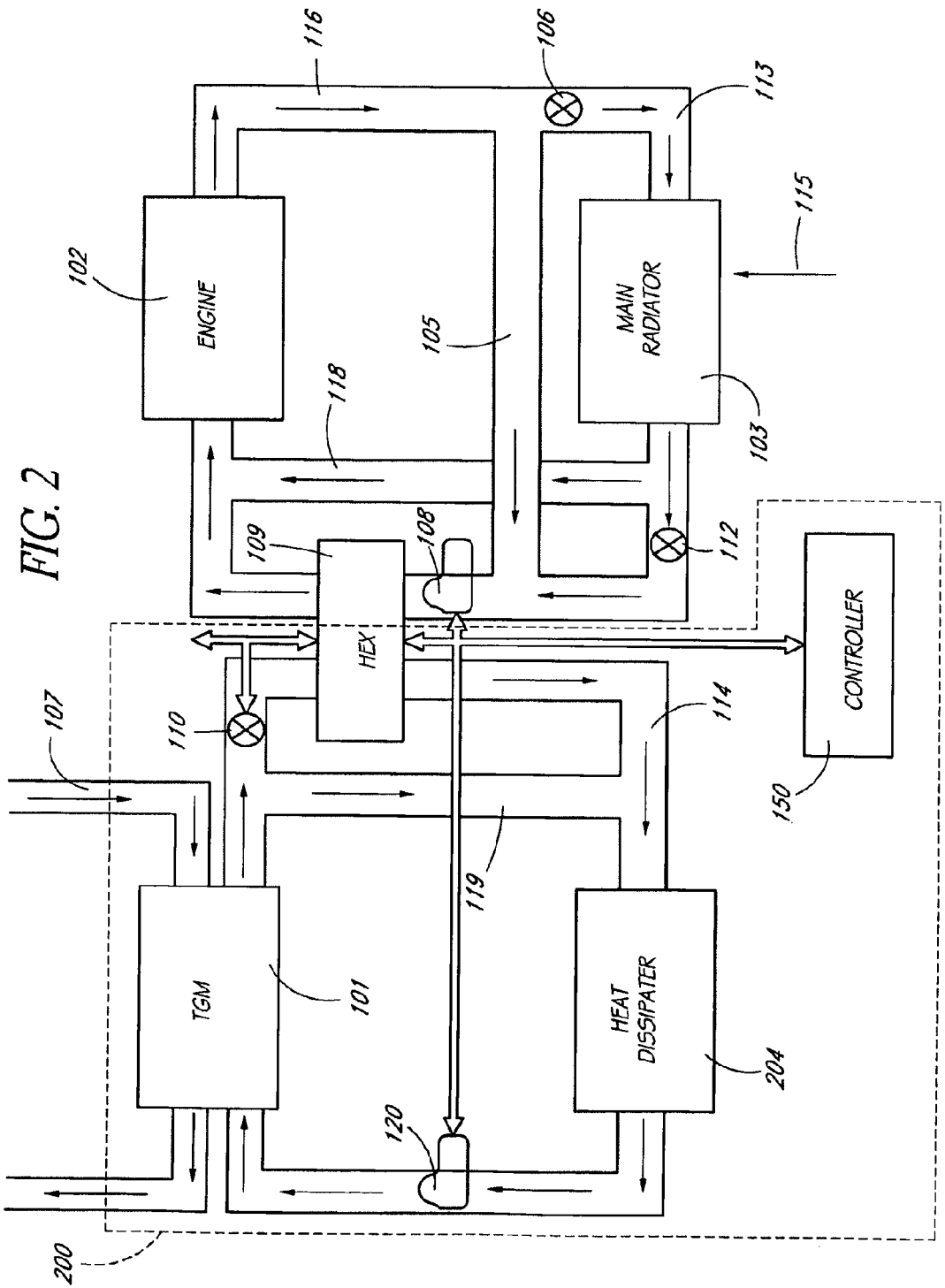
FIG. 2 illustrates another embodiment of a thermoelectric generation system with an cold-side intermediate heat transfer loop.

FIG. 2 shows another embodiment for a thermoelectric generation system 200, similar in many respects to that of the embodiment to FIG. 1. An engine 102, such as an engine in a car, provides a source of heat. The engine 102 has a cooling system using a radiator 103. A separate intermediate cold side loop uses a heat dissipater 204 instead of the auxiliary radiator 104 and the airflow 115 is removed (FIG. 1).

The heat dissipater 204 is representative of any other type of heat exchanger. For example, it could be the chassis of the vehicle. An auxiliary cold fluid 211 still flows through the heat dissipater 204 as did auxiliary cold-side working fluid 214 through the auxiliary radiator 104 (FIG. 1). The heat transfer mechanism in this embodiment preferably is dominated by a large surface area and convection as opposed to a more compact heat transfer surface area and forced air convection as was presented with the auxiliary radiator 104 in FIG. 1.

Hot Side Intermediate Loop

As with the cold-side intermediate loop, the present invention addresses the potential impedance mismatch for dynamic systems through an intermediate control loop for the hot-side of the TGM as well. In this embodiment, like the cold-side intermediate loop, the flow rate and temperature of the fluid can be adjusted to better match that needed to provide maximum power output and/or improved efficiency for a dynamic set of operating conditions. Thus, the power generator performs closer to optimal over a wider range of operating conditions.

The ability to control the flow rate in the intermediate loop controls the heat flux across the TE elements, where this is not possible in systems proposed in a conventional design. It also allows for more optimal thermodynamic cycles, such as thermal isolation in the direction of flow (as described in U.S. Pat. No. 6,539,729), to be implemented.

Thermal mass can also be provided in the intermediate loop sufficient to enable the power output of the generator system to be more constant over an entire dynamic cycle by storing heat energy during periods of high heat flux and releasing energy during periods of low heat flux. Controlling the pump speed can also aid in providing a more constant level of power. This ability to provide a constant thermal power level over a highly dynamic range of conditions can greatly simplify power conversion and controls for the generator system.

By incorporating the intermediate loop, the TE generator can also be isolated from the hot-side system, which is often operating under harsh conditions. This may be desirable in many instances, in particular where maintenance may be necessary on one system but it is undesirable to disturb the other system. For example, the intermediate loop allows the TE portion of the TE generator system to be contained within a separate hermetically sealed package. This can also allow for easier recycling of the TE material.

The intermediate loop also provides the ability to choose a better heat transfer fluid than the main heat source. If an intermediate loop fluid is chosen with better heat transfer characteristics than the primary hot fluid (e.g., engine exhaust), the thermoelectric generator module (TGM) can be built smaller. This compact size improves the ruggedness of the device and can enable it to fit applications where size, weight, and cost are critical.

The intermediate loop also permits the working fluid to be selected to be stable over the entire exposed temperature range. A working fluid having excellent heat transfer-related thermodynamic properties will minimize the amount of heat loss associated with the additional loop. Pump losses associated with moving the fluid through the control loop should be small in order to not offset the power generated by the TGM.

By having an intermediate loop, the possible array of working heat transfer fluids is greatly expanded. Liquid metals such as gallium and NaK have excellent thermodynamic properties and are stable liquids over a wide temperature range. As liquids, they also would help keep pumping losses at a minimum. However, they have very poor material compatibility with a variety of different materials, and, thus, are not necessarily good choices for this application. But, the existence of the intermediate loop provides the option to consider such fluids in the possible working fluids.

Other heat transfer liquids considered that are manufactured by such companies as Dow do not remain stable over certain temperatures. Even silicone liquids become unstable over 400° C.

For the present applications, the fluids that remain stable over wide temperature ranges are generally gases. Gases such as hydrogen and helium have excellent thermodynamic properties. Hydrogen, unfortunately, is a highly flammable fluid and can cause materials to become brittle, particularly at high temperature. Helium, however, is inert and, thus, has excellent material compatibility. It has excellent thermodynamic properties when compared to water. In some respects it has better thermodynamic properties than glycol solutions. Its main drawback is its density. Being a very light gas, at atmospheric pressure, pumping losses are high for helium. These pumping losses, however, can be minimized by increasing the fluid's working pressure as well as mixing the helium with a small amount of a heavier fluid. One such fluid is xenon, which is also an inert gas and is substantially heavier than helium. Xenon does not have good thermodynamic properties and may be more expensive than helium. Thus, in one embodiment, the amount of xenon used would be minimized.

There are other gas possibilities for the working fluid. These include $CO_2$ and air. Both of these gases are heavier than helium and, thus, do not require the addition of xenon, but they have worse thermodynamic properties.

Figure 3:
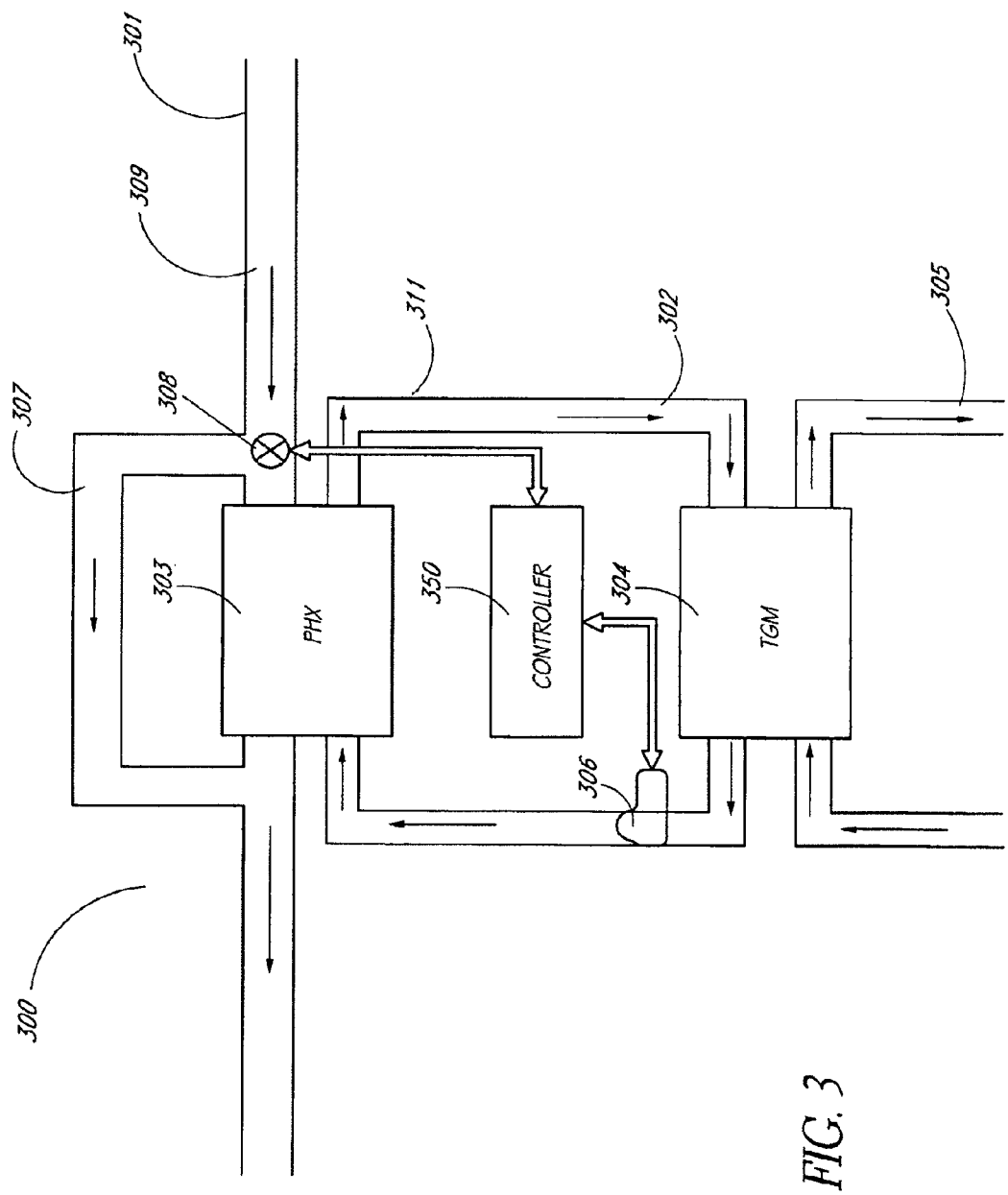
FIG. 3 illustrates a thermoelectric generation system with a hot-side intermediate heat transfer loop.

FIG. 3 shows the first embodiment of the power generator system 300 with intermediate loop control 311. A main hot fluid 301, which could be vehicle exhaust gas, superheated steam, or any heat source, flows through the primary heat exchanger (PHX) 303. The PHX 303 can be a shell and tube or any other heat exchanger type known in the art. If the temperature or mass flow rate of the main hot fluid 301 exceeds preset limits, a 3-way valve 308 or other flow directional device known in the art can be opened such that flow will be directed through the bypass 307 rather than through the PHX 303.

Preferably, a control system monitors the temperature and a controller 350 for the central system and adjusts the valve 308 to the correct level so that the system operates as effectively as practical. This helps to protect the thermoelectric (TE) material in the thermoelectric generator module (TGM) 304 from being overheated. In the example of an engine, this can also be used to prevent excessive backpressure in the main hot-side loop 309 (e.g., in the exhaust), which in the case of a motor vehicle can adversely affect the performance of the vehicle's engine. Preferably, the bypass 307 routes the main hot fluid (some small portion to virtually all of the fluid) around the PHX 303 and back to the main hot-side loop 309, when that improves performance or achieves some other desired result. The valve 308 thus allows partial flow to go through the bypass 307 and partial flow through the PHX 303 under the control of the controller 350. Preferably, the controller 350 has sensors at for at least the hot fluid 301, an intermediate loop fluid 302 and a cold-side working fluid 305. In one embodiment, the controller sensors would detect at least temperature, and possibly flow rate for the fluids. Also, the controller 350 preferably provides control for the valve 308 and pump 306, to control the flow rates and proportion the flow through valve properly.

In this embodiment, heat is transferred from the main hot fluid 301 to the intermediate loop hot-side working fluid 302 via the primary heat exchanger PHX 303. In one embodiment, the intermediate loop hot-side working fluid 302 can be a liquid or molten salt such as liquid metal or NaK. It can also be a high temperature heat transfer fluid such as those made by Dow. The intermediate fluid 302 can be superheated or saturated steam or another type of two-phase fluid. The intermediate fluid 302 can also be a gas like helium, hydrogen, air, or carbon dioxide or any other high heat transfer gas that can be operated at above atmospheric pressure in order to reduce pumping losses.

A pump 306 or other device capable of controlling flow known in the art 306 can control the thermal mass flow or thermal impedance of the intermediate loop fluid 302 to "match" or equal that of the hot fluid 301, if desired. This helps to maximize the effectiveness of the PHX 303. This is particularly important for a system where the hot fluid 301 flow rate or temperature fluctuates over a wide range. Maximizing the effectiveness of the PHX 303 over the dynamic range of hot fluid flows improves TGM 304 and thus the entire generator system 300 over an entire cycle. Without this control, the system would only operate at optimal performance over a very narrow range of operating hot fluid 301 flows. The intermediate loop 309 also provides a level of thermal storage for the system. The thermal mass of the intermediate loop fluid 302 provides a means of thermal energy storage, which can be augmented by the pump 306 flow speed.

The intermediate loop heat transfer fluid 302 is circulated around the hot-side intermediate loop 311 and through the TGM 304 using the pump 306. The TGM 304 preferably includes hot and cold side heat exchangers, TE elements, and electrical connectors between TE elements (not shown), preferably incorporating thermal isolation in the direction of working fluid flow, as described in U.S. Pat. No. 6,539,729, entitled Efficiency Thermoelectrics Utilizing Thermal Isolation. The TE elements in the TGM 304 can be thermally isolated advanced high power density designs or can be made of standard thermoelectric modules known in the art. Cold-side fluid 305 flows through the cold-side heat exchanger portion of the TGM 304 to complete the thermoelectric generator.

Figure 4:
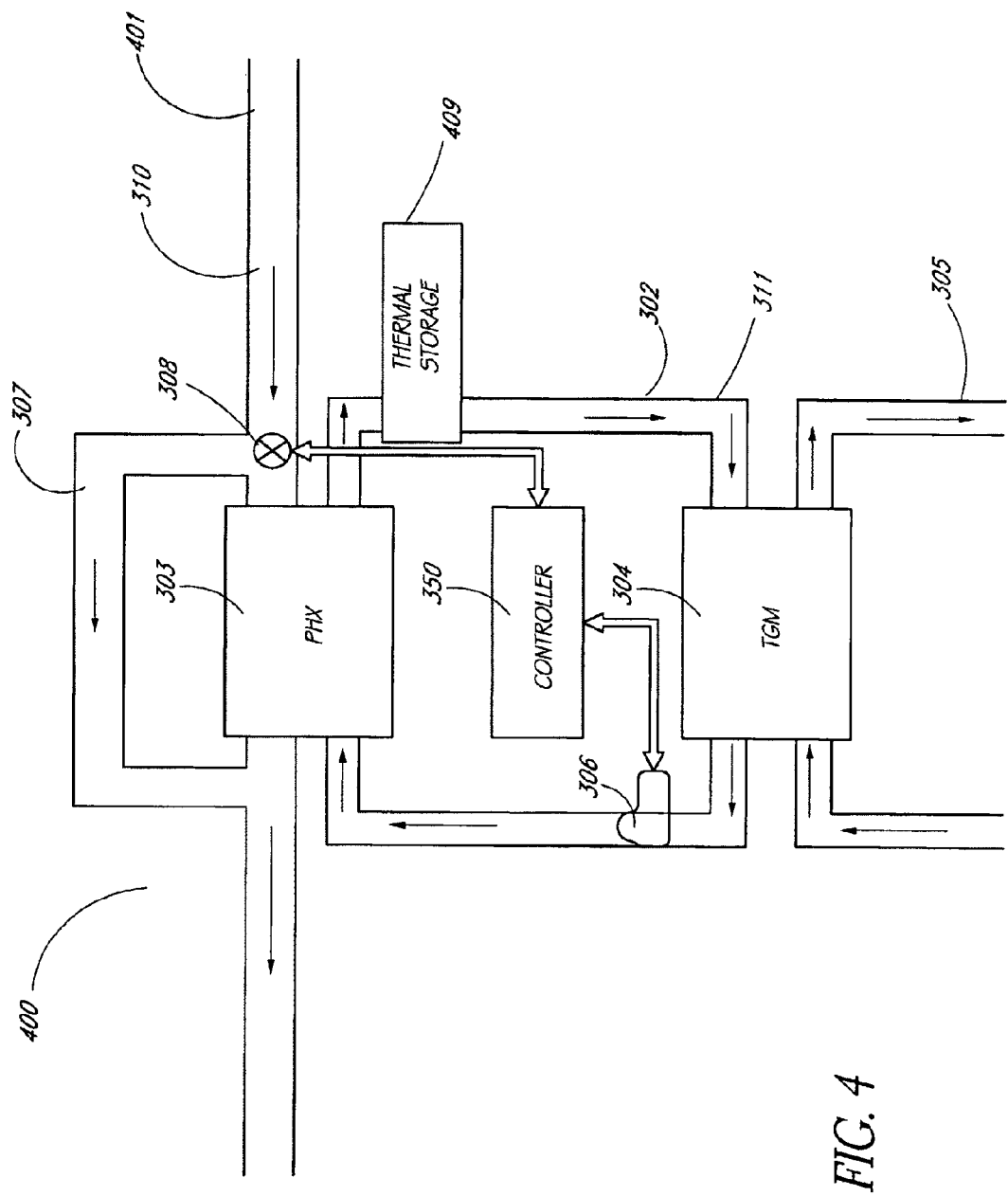
FIG. 4 illustrates another embodiment of a thermoelectric generation system with a hot-side intermediate heat transfer loop, similar to that depicted in FIG. 3, but with added heat capacity storage.

FIG. 4 illustrates a thermoelectric generation system 400 very similar to that of the system 300 of FIG. 3. This thermoelectric generation system 400 includes an additional thermal storage 409. Controller 350 preferably includes an added sensor for the thermal storage 409. The sensor permits the controller 350 to calculate whether additional thermal storage capacity is available, and effectively use this storage in controlling the operation of the system 400. This thermal storage 409 can be any type of media with thermal mass, including phase change material and the like. This thermal storage 409 enhances the thermal storage capacity of the intermediate loop 311 allowing the system 400 to produce useful power during periods of low temperatures and mass flows of the hot fluid 301 up to and including even when there is no hot fluid 301 flow. When there is no hot fluid flow, the system would then "borrow" heat from the thermal storage. Likewise, when there is an excess of thermal power above that which the system 400 is capable of utilizing efficiently, thermal power can be stored.

Figure 5:
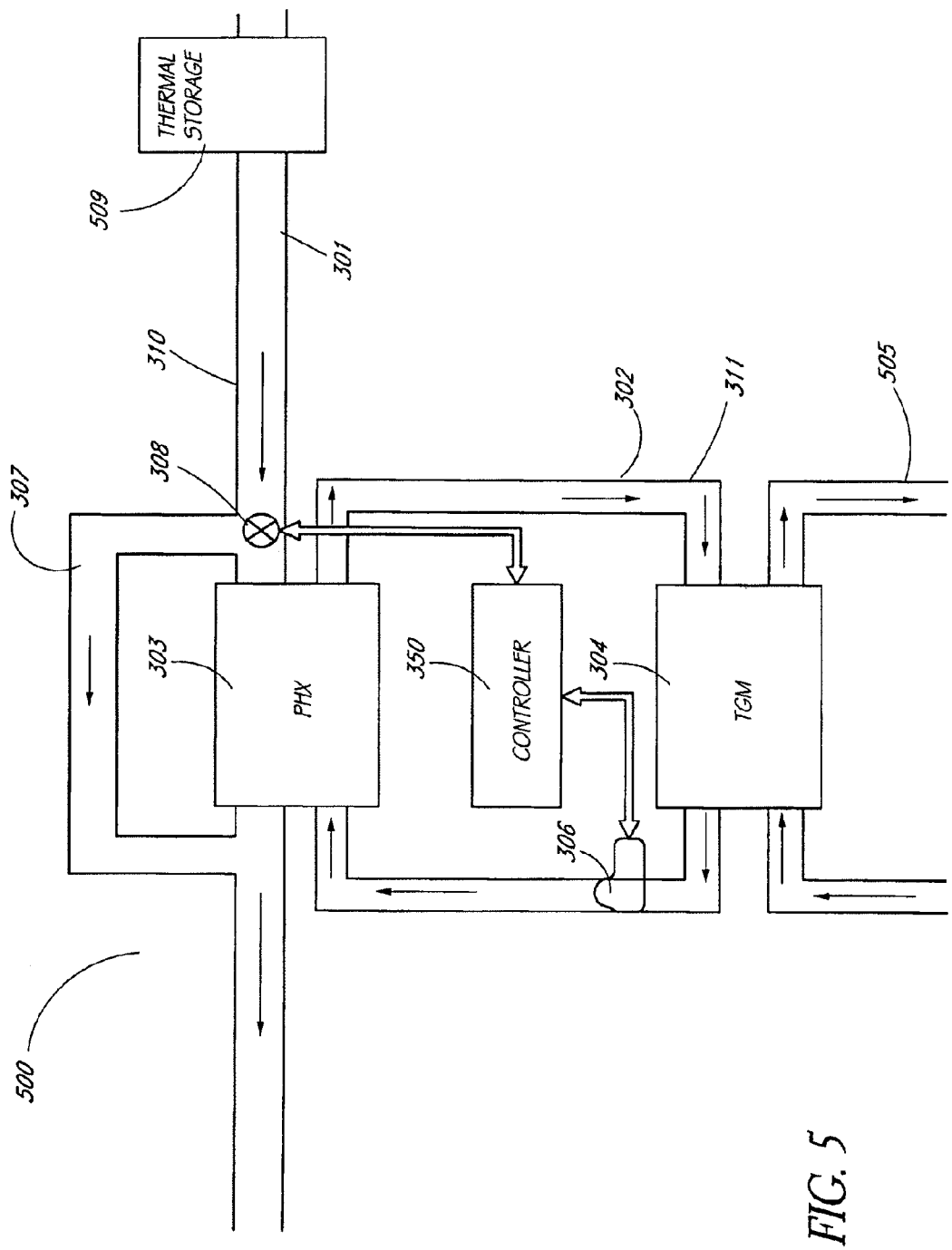
FIG. 5 illustrates another embodiment of a thermoelectric generation system with a hot-side intermediate heat transfer loop, similar to that depicted in FIG. 3, but with added heat capacity storage.

FIG. 5 shows a system 500 that is similar to that of the system 400 of FIG. 4. The difference is that the thermal storage 509 is located in the hot-side loop 310 rather than the intermediate loop 311. Again, the controller 350 preferably includes a sensor for the thermal storage 509, to detect the temperature of the thermal storage 409, under the control of controller 350. The thermal storage 509 at this location in this embodiment is advantageous if there is space (volume), weight, or other considerations that would prevent the thermal storage from being located as it is in FIG. 4.

What is claimed is:
1. A thermoelectric power generation system comprising:
  a thermoelectric generator having thermoelectrics with at least one cold side and at least one hot side, the TE generator configured to generate electrical power when a temperature gradient is present between the at least one cold side and the at least one hot side;
  a first working fluid in thermal communication with at least one heat source;

a second working fluid flowing in an intermediate heat transfer loop and separate from the first working fluid, the second working fluid in thermal communication with the at least one hot side, and in thermal communication with the first working fluid such that heat is transferred from the first working fluid to the second working fluid and heat is positively transferred from the second working fluid to the at least one hot side; and a flow control system adapted to control the flow of the second working fluid in response to changes in heat originating from the at least one heat source.

2. The thermoelectric power generation system of claim 1, wherein the first working fluid flows through the at least one heat source.

3. The thermoelectric power generation system of claim 1, further comprising a thermal storage.

4. The thermoelectric power generation system of claim 1, further comprising a heat exchanger in thermal communication with the first working fluid and in thermal communication with the second working fluid, and further comprising a heat exchanger bypass controllable via a controller, to cause some or all of the heat from the at least one heat source to bypass the heat exchanger.

5. The thermoelectric power generation system of claim 1, wherein the flow control system comprises a controller and one or more flow control devices operatively coupled to the controller, wherein the one or more flow control devices modify the flow of the second working fluid in response to signals from the controller.

6. A thermoelectric power generation system comprising:
a thermoelectric generator having thermoelectrics with at least one cold side and at least one hot side configured to generate electrical power when a temperature gradient is present across the at least one cold side and the at least one hot side;
a first working fluid in thermal communication with at least one heat source;
a second working fluid flowing in an intermediate heat transfer loop and in thermal communication with the at least one cold side, the first working fluid and the second working fluid separate from one another, wherein heat is positively transferred from the second working fluid to the first working fluid; and
a controller in communication with flow control devices adapted to control the flow of the second working fluid in response to changes in operating conditions for the thermoelectrics.

7. The thermoelectric power generation system of claim 6, wherein the first working fluid flows through the at least one heat source.

8. The thermoelectric power generation system of claim 6, wherein the at least one heat source comprises an engine having a coolant system.

9. The thermoelectric power generation system of claim 8, wherein the second working fluid can be selectively placed in thermal communication with the coolant system of the engine, such that during engine warm-up, heat transferred from the thermoelectrics to the second working fluid is further transferred to the cooling system for the engine, thereby decreasing warm-up time for the engine.

10. The thermoelectric power generation system of claim 6, further comprising a heat exchanger in thermal communication with the first working fluid and in thermal communication with the second working fluid, and further comprising a heat exchanger bypass controllable via the controller, to cause some or all of the heat from the at least one heat source to bypass the heat exchanger.

11. The thermoelectric power generation system of claim 6, wherein the flow control system comprises a controller and one or more flow control devices operatively coupled to the controller, wherein the one or more flow control devices modify the flow of the second working fluid in response to signals from the controller.

* * * * *